United States Patent
Lu et al.

(10) Patent No.: US 6,792,179 B2
(45) Date of Patent: Sep. 14, 2004

(54) OPTICAL THUMBTACK

(75) Inventors: Daoqiang Lu, Chandler, AZ (US); Gilroy J. Vandentop, Tempe, AZ (US); Steven N. Towle, Phoenix, AZ (US); Henning Braunisch, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/334,749

(22) Filed: Dec. 31, 2002

(65) Prior Publication Data

US 2004/0126058 A1 Jul. 1, 2004

(51) Int. Cl.[7] .............................................. G02B 6/32
(52) U.S. Cl. ........................ 385/33; 385/31; 385/32
(58) Field of Search ............................. 385/33, 14, 31, 385/32, 34, 129, 130, 131

(56) References Cited

U.S. PATENT DOCUMENTS 4,732,599 A * 3/1988 Bennion ................ 65/30.13
5,581,379 A * 12/1996 Aoyama et al. ................ 349/5
2002/0153492 A1 * 10/2002 Sekine et al. ........... 250/370.11

OTHER PUBLICATIONS

Elmar Griese, A High–Performance Hybrid Electrical–Optical Interconnection Technology for High–Speed Electronic Systems. IEEE Transactions on Advanced Packaging, vol. 24, No. 3, Aug. 2001. pp. 375–383.

Yuzo Ishii, et al., SMT–Compatible Optical–I/O Chip Packaging for Chip–Level Optical Interconnects. IEEE 2001 Electronic Components and Technology Conference. pp. 870–875.

* cited by examiner

Primary Examiner—Thien M. Le
Assistant Examiner—Uyen-Chau Le
(74) Attorney, Agent, or Firm—Kenneth J. Cool (57) ABSTRACT

An optical or optoelectroronic component is mounted to a substrate, and an optical thumbtack is inserted into a through-hole of the substrate. The optical thumbtack is positioned to receive light from or send light to the optical or optoelectronic component and provide a conditioned, for example collimated or focused, beam. The optical thumbtack comprises a lens portion, a spacer portion, and a foot portion. Light may enter the thumbtack from either direction.

31 Claims, 11 Drawing Sheets

OPTICAL THUMBTACK

FIELD

The subject matter disclosed herein generally relates to the field of optical and/or optoelectronic circuits and in particular relates to techniques to transfer optical signals.

DESCRIPTION OF RELATED ART

Various designs for integrated circuit boards, such as motherboards, have been proposed that have electronic, optoelectronic, and/or optical components including integrated optical waveguides. However, board designers are reluctant to combine electronic fabrication techniques and optical fabrication techniques.

BRIEF DESCRIPTION OF THE DRAWINGS

FIG. 5b is a 3-dimensional representation that shows one embodiment in which one or more larger openings in a substrate may accommodate multiple lens and spacer portions of an array, such as that of FIG. 5a.

FIG. 11b shows an embodiment of a substrate or board that can accomodate an optical assembly array, such as that of FIG. 11a.

Note that use of the same reference numbers in different figures indicates the same or like elements.

DETAILED DESCRIPTION

A pre-fabricated optical thumbtack is used to manipulate light on its path to or from an optical or optoelectronic component such as, for example, a vertical-cavity surface-emitting laser (VCSEL) or a photodetector, mounted to a substrate or board. The optical thumbtack is easily inserted into a through-hole of the substrate/board, and automatically provides good passive optical alignment with one or more optical or optoelectronic components. Thus, the optical thumbtack may be used to provide optical alignment with one or more light receiving or light transmitting optical or optoelectronic components. Other types of active or passive optical or optoelectronic devices include, for example, a light modulator, a lens, an optical waveguide, a diffraction grating, and so forth. In general, the optical thumbtack may serve to condition light entering it in either direction. Thus, depending upon usage, the optical thumbtack, for example, may serve to focus light leaving it or may serve to collimate light entering it.

The Optical Thumbtack

An optical thumbtack is described with respect to FIGS. 1–7; an optical assembly is described with respect to FIGS. 8–14. The optical thumbtack may be combined with the optical assembly as described, for example, with respect to FIG. 13.

Figure 1:
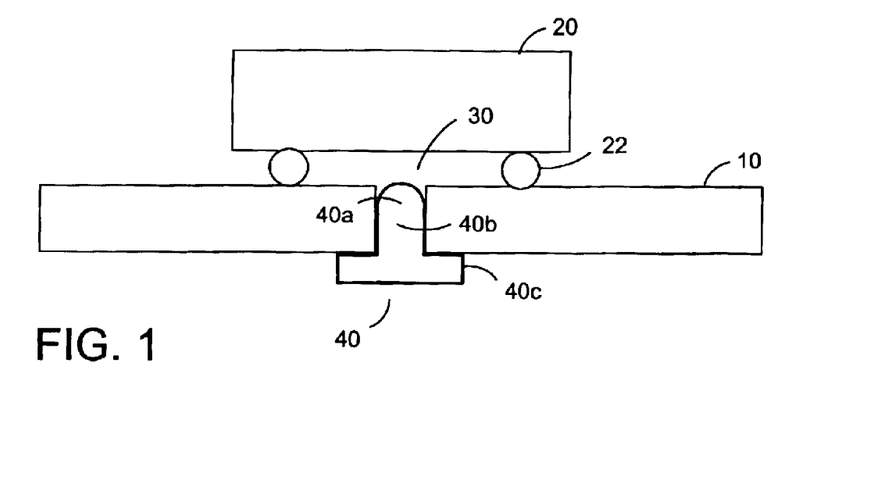
FIG. 1 is a schematic diagram showing one embodiment of a cross sectional view of an optical or optoelectronic component such as a light source, for example a vertical-cavity surface-emitting laser (VCSEL), mounted to a substrate with an optical thumbtack, as will be described.

FIG. 1 is a schematic diagram showing one embodiment of a cross sectional view of an optical or optoelectronic component 20, for example a light source such as a VCSEL, or a photodetector, mounted to a substrate 10. In one embodiment, the optical or optoelectronic component 20 is mounted using a flip-chip technique that both attaches and aligns the component to the substrate using solder balls 22. The substrate 10 may be any device having a substantially planar surface, such as but not limited to, a circuit board, a motherboard, a semiconductor material, an insulating material, and so forth.

The optical or optoelectronic component 20 is positioned over a through-hole 30 in the substrate. Light is provided from one side into the through-hole 30. An optical thumbtack 40 is useful for helping to assure that the majority of the light provided passes through the through-hole 30 and is optimally conditioned upon leaving the through-hole via the thumbtack.

The optical thumbtack 40 is inserted into the through-hole 30 of the substrate 10. In one embodiment, the optical thumbtack comprises a lens portion 40a, a spacer portion 40b, and a foot portion 40c.

In one embodiment, the lens portion 40a is convex. The lens portion may remain recessed within the through-hole of the substrate or alternatively may either partially or fully protrude from the through-hole into the region between the substrate 10 and the optical or optoelectronic component 20. Additionally the lens portion may be spherical, for example, hemispherical, in which a cross section of the lens has a constant radius of curvature, or the lens may be aspherical, in which a cross section of the lens, for example, may have a smaller radius of curvature at the top of the lens and a larger radius of curvature towards the sides of the lens, making the lens more pointed at the top. One particular example of such an aspherical lens is a hyperbolic lens. The use of an aspherical lens can be useful for avoiding or correcting undesired optical effects such as spherical aberration.

The spacer portion 40*b* provides an optical pathway between the lens portion and the foot portion. In one embodiment, the spacer portion is designed to fit snuggly in the through-hole so that once inserted, it will not fall out. The optical thumbtack may alternatively or additionally be attached to the substrate via an adhesive such as an epoxy or other manner of attachment. By inserting the optical thumbtack 40 into the through-hole, good passive alignment is automatically achieved between the optical thumbtack 40 and the optical or optoelectronic component 20.

The foot portion 40*c* allows the optical thumbtack to be inserted up to a predetermined length before the foot portion 40*c* abuts against the substrate 10. In one embodiment, the foot portion 40*c* has a slightly tilted base surface, and reflections off the bottom of the foot portion 40*c* are not reflected back toward the light source. In another embodiment, the foot portion includes a second lens portion, such as formed by a convex base surface. An anti-reflective coating may cover the lens portion 40*a* and/or the foot portion 40*c* so that there is low loss from reflection.

The optical thumbtack may be made from a variety of different optical materials. In one embodiment, the optical thumbtack comprises an organic polymer such as polycarbonate, polyimide, polycyanurates, polyacrylate or benzocyclobutene (BCB). However, various other optical materials may alternatively be used. In one embodiment, the optical thumbtack is formed in a molding process, such as injection molding.

Figure 2:
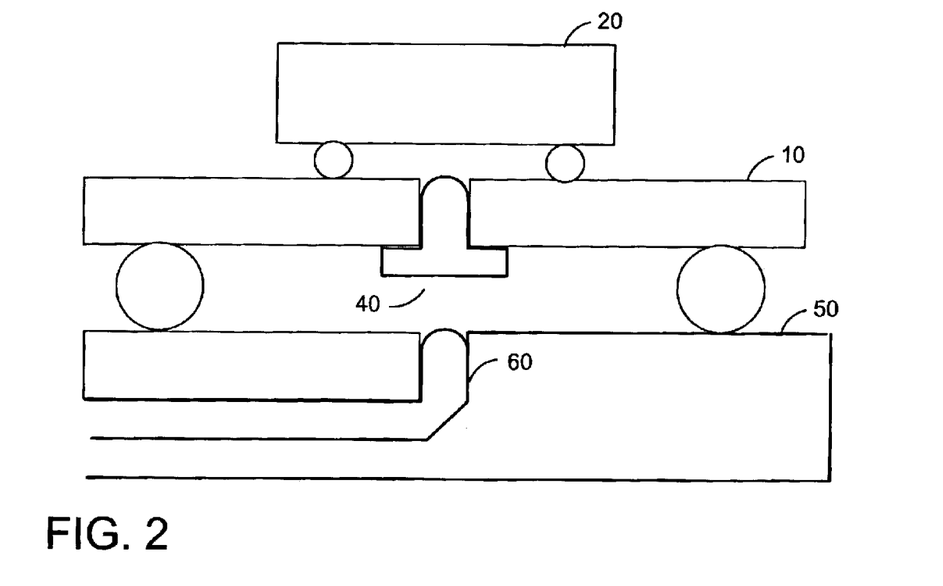
FIG. 2 is a schematic diagram showing one embodiment of a cross sectional view of an optical or optoelectronic component such as a light source, for example a VCSEL, mounted to a substrate with an optical thumbtack, which is in turn mounted to a second surface, such as a second substrate or a board.

FIG. 2 is a schematic diagram showing one embodiment of a cross sectional view of an optical or optoelectronic component 20, for example a light source such as a VCSEL, mounted to a substrate 10, which is in turn mounted to a second surface, such as on a second substrate or a board 50. In this embodiment, the substrate 10 is soldered to board 50, which automatically aligns the optical thumbtack 40 with a waveguide 60 of the board 50. However, alternate packaging technologies for physically coupling the substrate 10 to the board 50 may be used, such as, but not limited to the following technologies: a ball grid array (BGA) package, a ceramic BGA package, a plastic BGA package, a pin grid array (PGA) package, an organic land grid array (OLGA) package, and the like.

The waveguide 60 of the board 50 may be optically coupled to other optical components such as a photodetector (not shown), as is well known. In one embodiment, the waveguide is integrated into the board as shown in FIG. 2. In another embodiment, the waveguide is pre-fabricated, and is inserted into the board 50 as will be described with respect to FIGS. 8–14.

In one example, the thickness of substrate 10 is approximately 1100 microns, the BGA ball diameter is approximately 625 microns, and the board thickness is approximately 1500 microns. A bottom-emitting VCSEL aperture with diameter of approximately 10 microns may have a standoff height of approximately 75 microns and may have a beam divergence of approximately 20 degrees full width at half maximum (FWHM) with a ring-shaped intensity distribution. The diameter of the through-hole may be approximately 250 microns and the diameter of the hemispherical lens may be approximately 220 microns.

Figure 3:
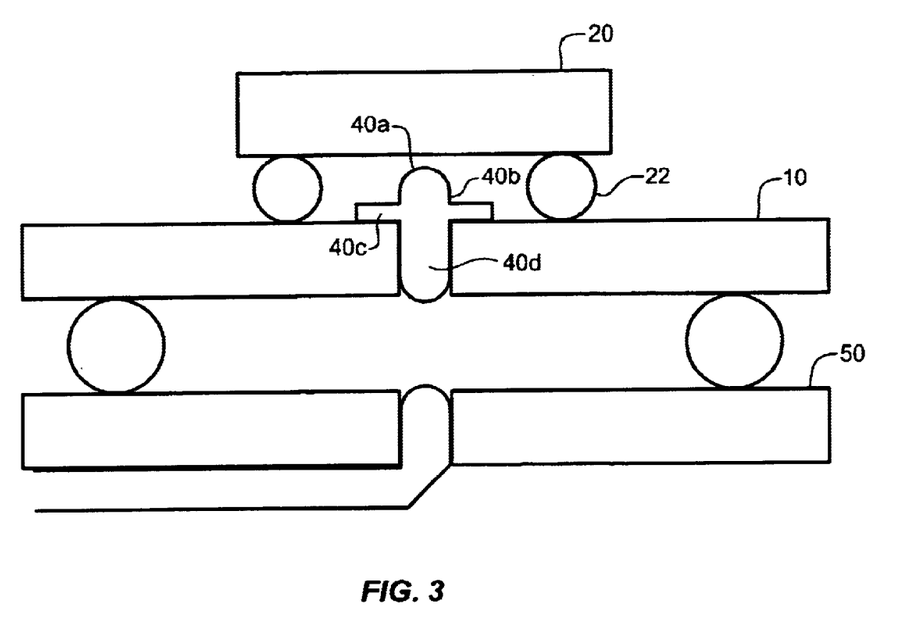
FIG. 3 is a schematic diagram showing another embodiment of a cross section of an optical or optoelectronic component and a substrate with an optical thumback and a second substrate or a board.

FIG. 3 is a schematic diagram showing another embodiment of a cross section of an optical or optoelectronic component and an optical thumbtack. In this embodiment, the optical thumbtack is placed into the opposite side of the through-hole of the substrate, and then the optical or optoelectronic component is flip-chip bonded to the substrate. In addition to the standard lens portion 40*a*, spacer portion 40*b*, and foot portion 40*c*, there is also a second lens portion 40*d* that extends into or protrudes from the through-hole of the substrate.

Figure 4:
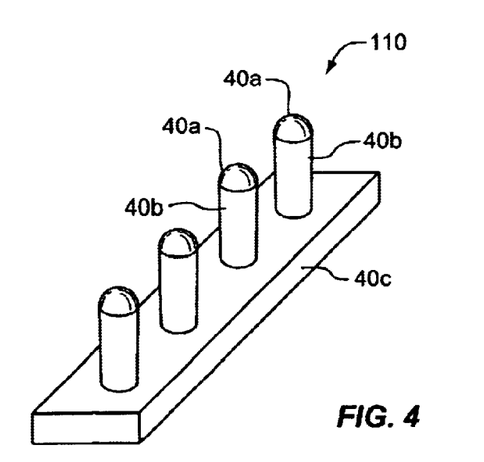
FIG. 4 is a 3-dimensional representation of a 1-D array of optical thumbtacks.
Figure 5A:
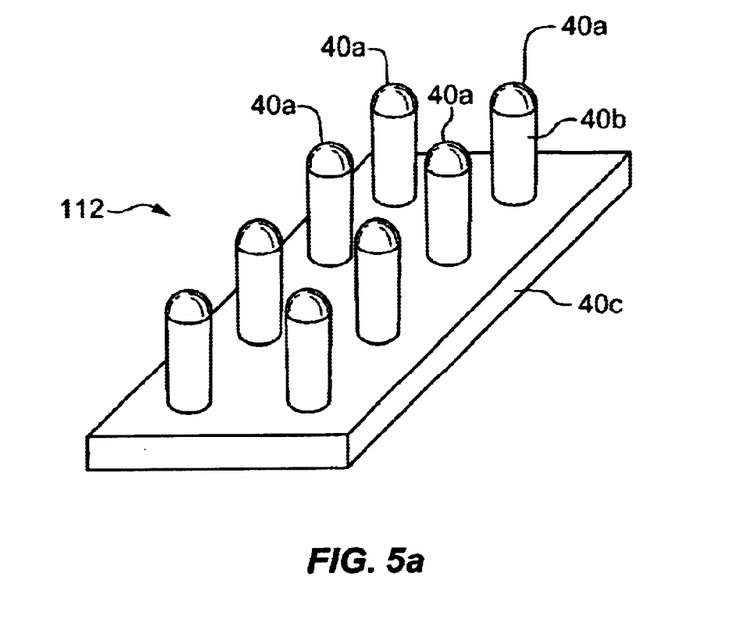
FIG. 5a is a 3-dimensional representation of a 2-D array of optical thumbtacks.
Figure 5B:
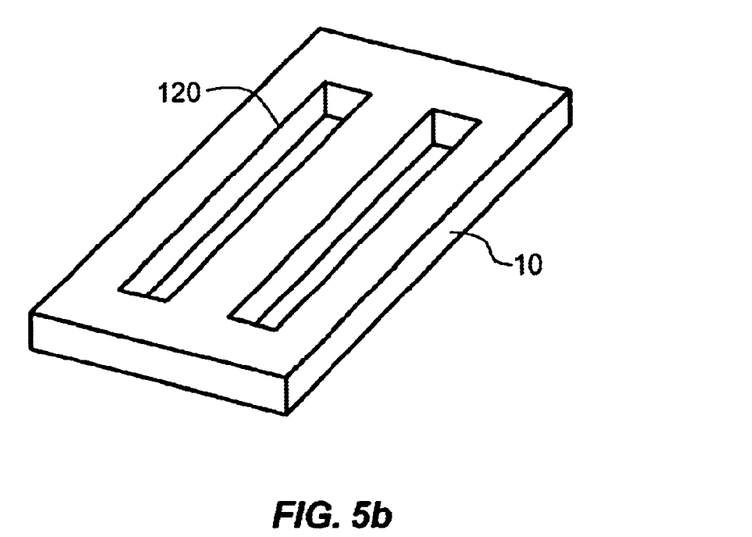
Figure 5C:
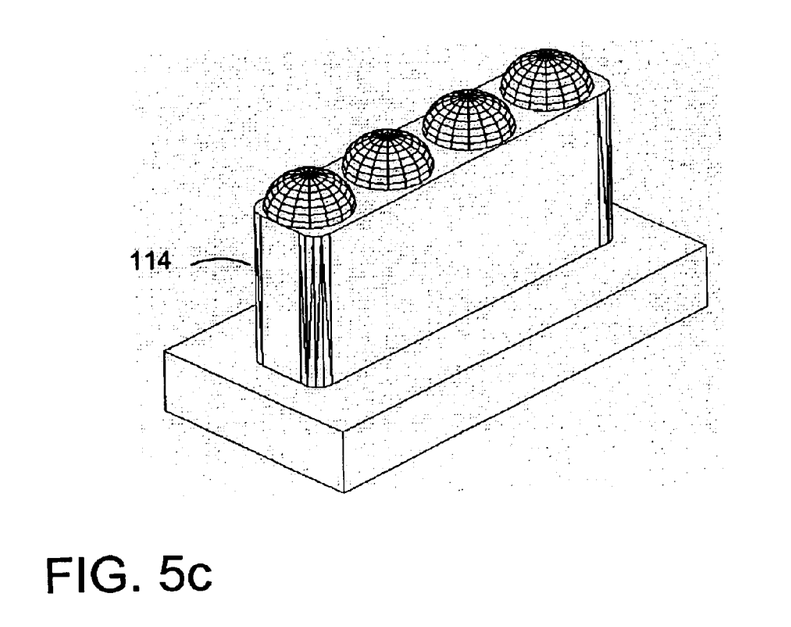
FIG. 5c is a 3-dimensional representation that shows one embodiment of an optical thumbtack with a 1-D array of lens portions that share a common spacer portion.

FIG. 4 is a 3-dimensional representation of an array of optical thumbtacks 110. The optical thumbtacks 110 share a common foot portion 40*c*, however, the lens portions and spacer portions are associated with respective optical or optoelectronic components coupled to one or more substrates. The array of optical thumbtacks may be used in a design such as an optical bus, in which multiple optical signals are communicated in parallel. The array of optical thumbtacks 110 may form a 1-dimensional array or a 2-dimensional array 112, as shown in FIG. 5*a*. FIG. 5*b* is a 3-dimensional representation that shows one embodiment in which one or more larger openings 120 in the substrate 10 may accommodate multiple lens and spacer portions of an array, such as that of FIG. 5*a*. Instead of providing a corresponding single through-hole for each of the lens/spacer portions, a larger through-hole 120 may accommodate multiple lens and/or spacer portions. The spacer portions of arrays of optical thumbtacks 110 or 112 may also be merged together so as to form one solid block 114 supporting a 1-dimensional or 2-dimensional array of lens portions 40*a*, as shown in FIG. 5*c*. In another embodiment the spacer portions are immersed into a block of a different solid material. The pitch of parallel waveguides, such as in an array of waveguides, may be in the range of approximately 50 to 250 microns.

Figure 6:
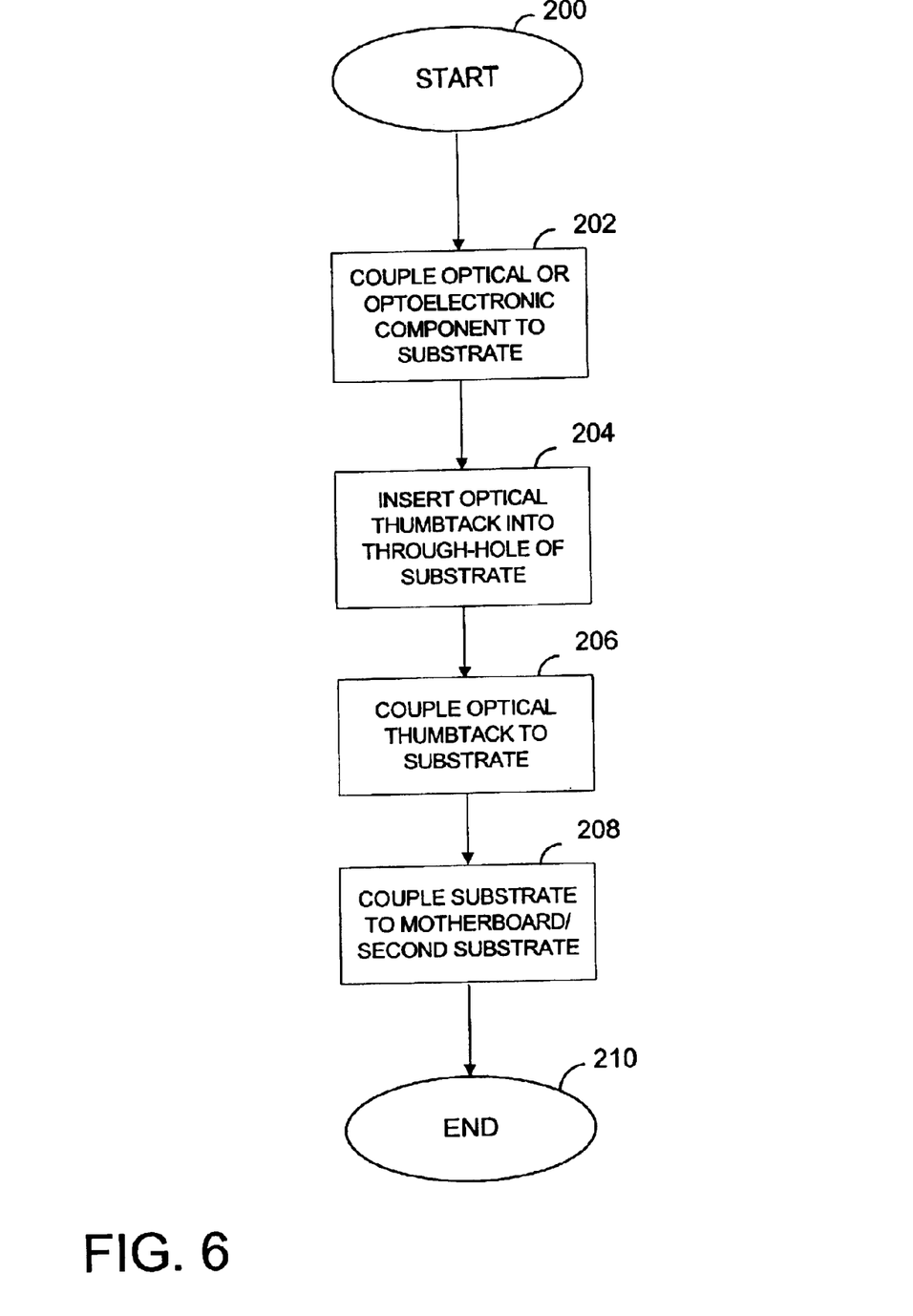
FIG. 6 is a flowchart showing a first embodiment of coupling an optical thumtack to an optical or optoelectronic component, such as that described with respect to FIG. 2.

FIG. 6 is a flowchart showing a first embodiment of physically coupling an optical thumbtack to an optical or optoelectronic component, such as that described with respect to FIG. 2. The flowchart starts at block 200 and continues at block 202, at which an optical or optoelectronic component is physically coupled to a substrate having a through-hole in it. In one embodiment, the optical or optoelectronic component is physically coupled to the substrate via a flip-chip bonding process. However, various other bonding techniques may be used. The through-hole in the substrate may be formed by laser drilling, mechanical drilling, or other known methods. Additionally, the through-hole's position may be lithography-defined, or otherwise precision-defined, to provide accurate optical alignment down to micron level accuracy. At block 204, an optical thumbtack is inserted into the through-hole a predetermined distance. In one case, this distance is defined by the foot portion of the optical thumbtack preventing the optical thumbtack from being inserted further into the through-hole. At block 206, the optical thumbtack is optionally permanently physically coupled, e.g., by an adhesive or epoxy, to the substrate. The entire substrate may then be physically coupled to a second surface such as on a second substrate or a circuit board, e.g., motherboard, as shown at block 208. The flowchart ends at block 210.

Figure 7:
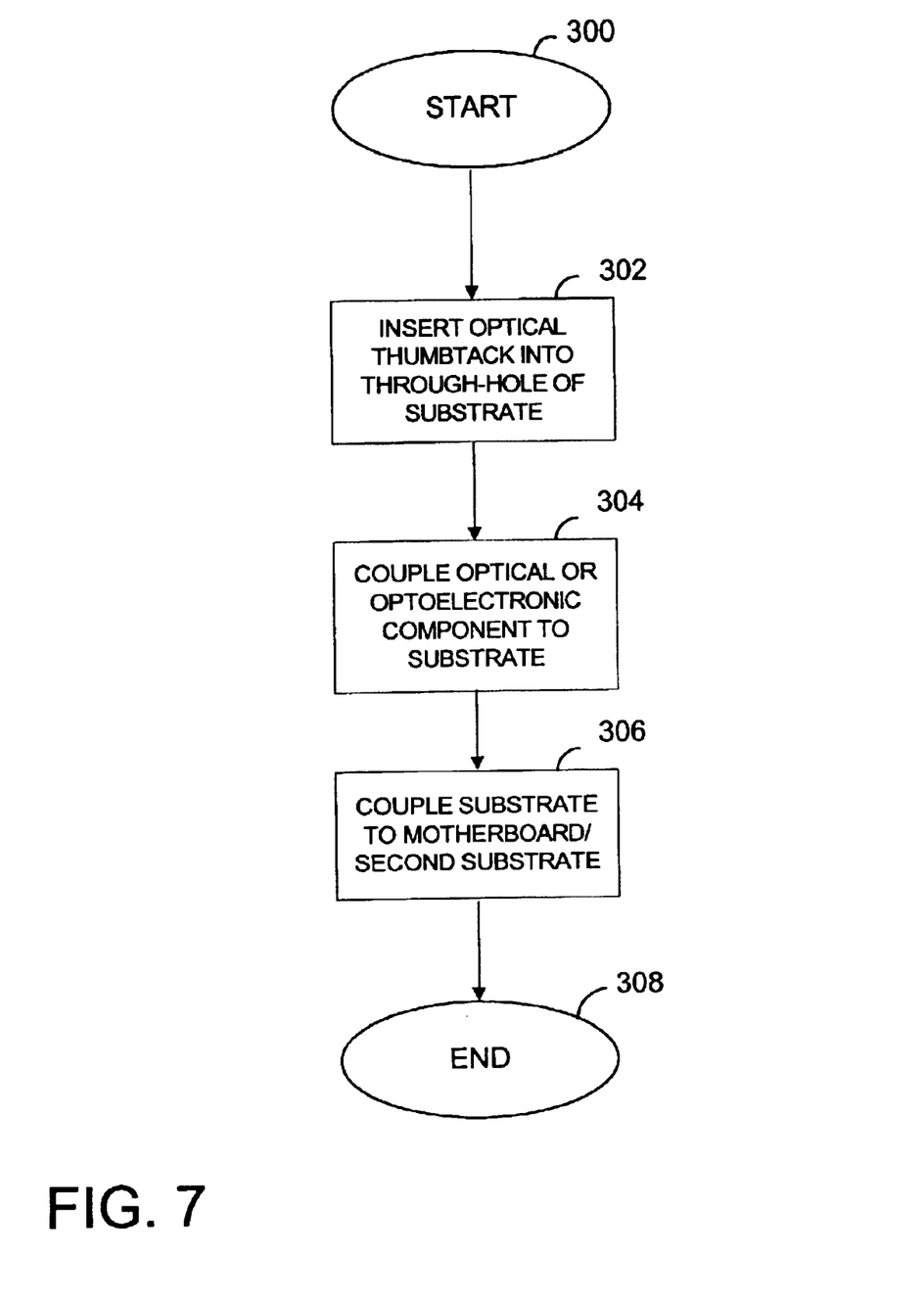
FIG. 7 is a flowchart showing a second embodiment of coupling an optical thumbtack to an optical or optoelectronic component such as that shown in FIG. 3.

FIG. 7 is a flowchart showing a second embodiment of coupling an optical thumbtack to an optical or optoelectronic component such as that shown in FIG. 3. The flowchart starts at block 300 and continues at block 302, at which an optical thumbtack is inserted into a through-hole of a substrate. The flowchart continues at block 304, at which an optical or optoelectronic component is physically coupled to the substrate, and the optical or optoelectronic component is positioned to be in optical alignment with the optical thumbtack. At block 306, the substrate is coupled to a second surface, such as a circuit board, e.g., motherboard, or a second substrate. The flowchart ends at block 308.

In one embodiment, the optical thumbtack is optically aligned with a waveguide of the second surface, and the waveguide is prefabricated so that it can be readily attached to the substrate/board and provide good passive alignment.

The Optical Assembly

Figure 8:
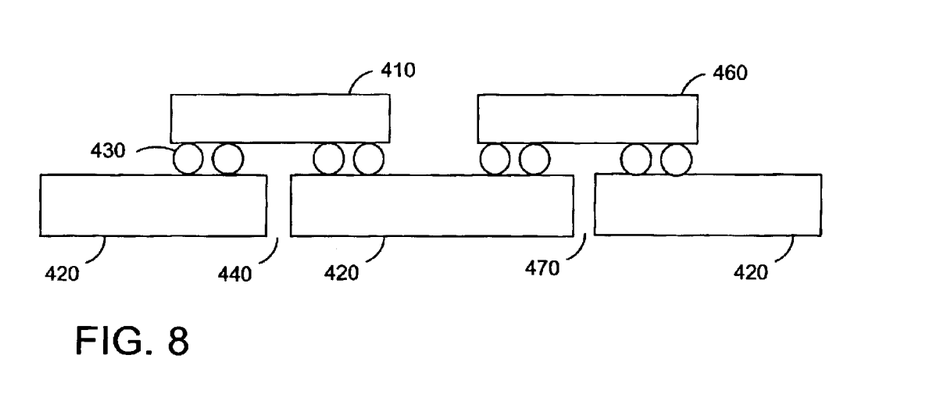
FIG. 8 is a schematic diagram showing one embodiment of an optical system fabricated to make use of a prefabricated waveguide.

FIG. 8 is a schematic diagram showing one embodiment of an optical system fabricated to make use of a prefabricated waveguide. In this embodiment, an optical or optoelectronic component 410 such as an optical package operating in a transmit mode or a light source is coupled to a substrate or board 420 via solder balls 430. A through-hole 440 is aligned to the optical or optoelectronic component 410. This alignment may be lithographically defined such that the optical or optoelectronic component 410 aligns over the through-hole 440 by solder joint self-alignment during reflowing to provide good passive alignment to the through-holes. A second optical or optoelectronic component 460 such as an optical package operating in a receive mode or a photodetector may be similarly aligned over a through-hole 470. In some embodiments, the transmit and receive functions of components 410 and 460 are mutually exchangeable and the components 410 and 460 may each perform both of these functions.

Figure 9:
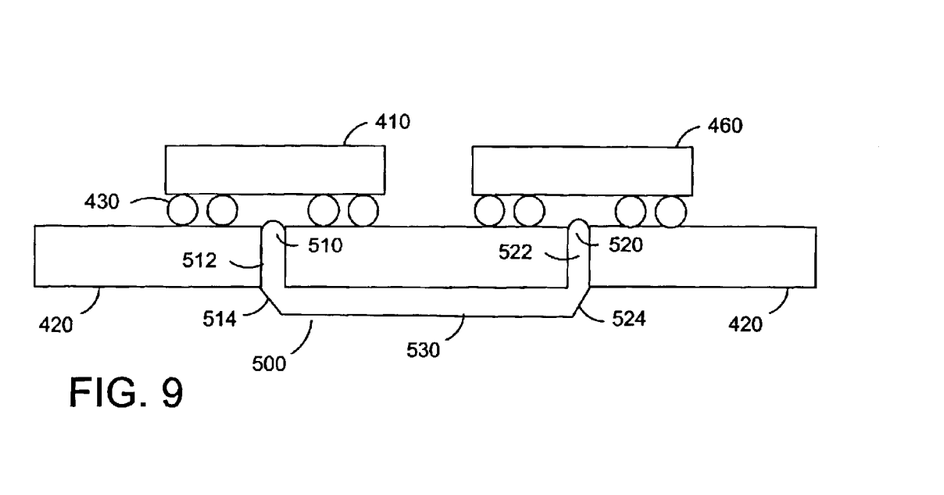
FIG. 9 shows a schematic diagram of a prefabricated optical assembly coupled to the embodiment of FIG. 8.

FIG. 9 shows a schematic diagram of a prefabricated optical assembly 500 coupled to the optical system of FIG. 8. In one embodiment, the optical assembly 500 is inserted into the through-holes 440 and 470 to optically couple the optical or optoelectronic component 410 to the optical or optoelectronic component 460. Optionally, the optical assembly 500 may be permanently physically coupled, e.g., by an adhesive or epoxy, to the substrate or board 420.

In one embodiment, the optical assembly 500 comprises a lens portion 510, an optical spacer 512, and a coupler 514 on one end, and a second lens portion 520, a second optical spacer 522, and a second coupler 524 on the other end. The two ends are coupled together via an optical waveguide 530.

In one embodiment, the optical assembly 500 comprises glass or a polymer such as polycarbonate, polyimide, polyacrylate, polycyanurates or benzocyclobutene (BCB), or a combination thereof. However, various other optical materials may alternatively be used. The optical assembly 500 may be formed in a molding process, such as injection molding. The waveguide of the optical assembly 500 can alternatively be fabricated via a planar or linear manufacturing process, in which a waveguide is formed between cladding regions. The lens and spacer portions can be subsequently attached to the planar waveguide, and the coupler portions may be formed by laser ablation or microtoming.

Figure 10:
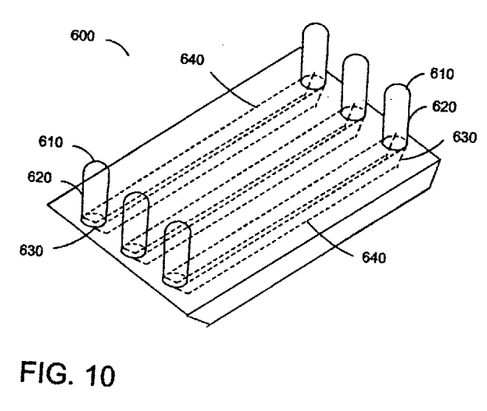
FIG. 10 shows a 3-dimensional schematic diagram of a second embodiment of an optical assembly, in which an array of optical assemblies is employed to provide multiple parallel optical couplings between a first array of optical or optoelectronic components and a second array of optical or optoelectronic components.

FIG. 10 shows a 3-dimensional schematic diagram of a second embodiment of an optical assembly, in which an array of optical assemblies 600 is employed to provide multiple parallel optical couplings to an array of light receiving and/or transmitting elements. The optical assemblies may be made by a molding process and then the array 600 may be formed by binding the separate waveguides 640 together, or the optical assemblies may be made using a planar waveguide process, in which multiple waveguides are made in a planar substrate, and then the lens 610, spacer 620 and coupler 630 portions are subsequently attached to and/or formed on the planar substrate. The pitch of the waveguides may be in the range of 50 to 250 microns, similar to that of the optical thumbtack.

Figure 11A:
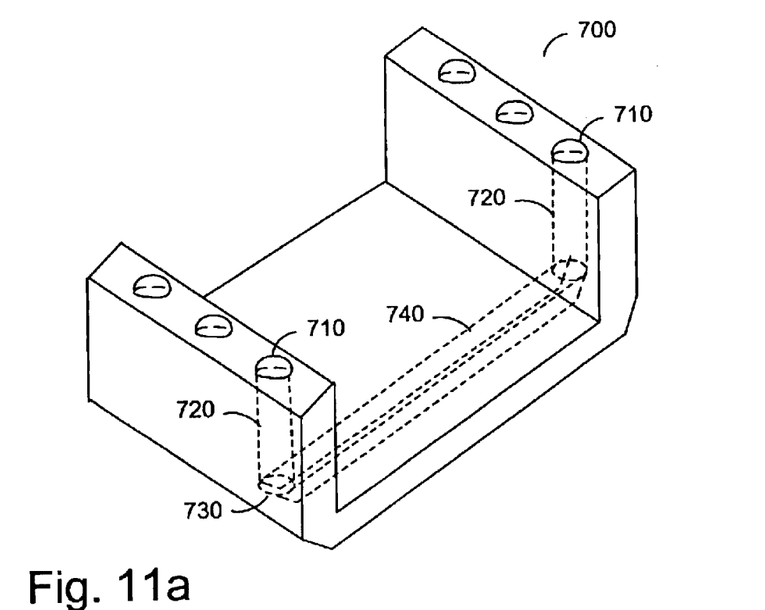
FIG. 11a shows another embodiment of an optical assembly array.

FIG. 11a shows another embodiment of an optical assembly array 700. In this case, a structure is formed via a molding process that integrates the lens 710, spacer 720, coupler 730 and waveguide 740 portions. Alternatively, one or more portions may be physically coupled to the structure after the mold process. For example, the lens portions may be separately joined to the assembly array structure afterwards, or formed by micro-dispensing drops of a liquid, ultraviolet-curable optical polymer and curing.

The lens structure of the optical assembly may be spherical, hemispherical or aspherical, similar to the lens of the optical thumbtack. The lens and spacer portions are designed to properly focus the incoming light onto the coupler portion and condition (e.g., collimate) the outgoing light coming from the coupler portion, based on the refractive index of the material and the curvature of the lens. The coupler section may take advantage of total internal reflection, or may use a mirrored surface or diffraction grating for redirecting light between the spacer portions and the waveguide.

Figure 11B:
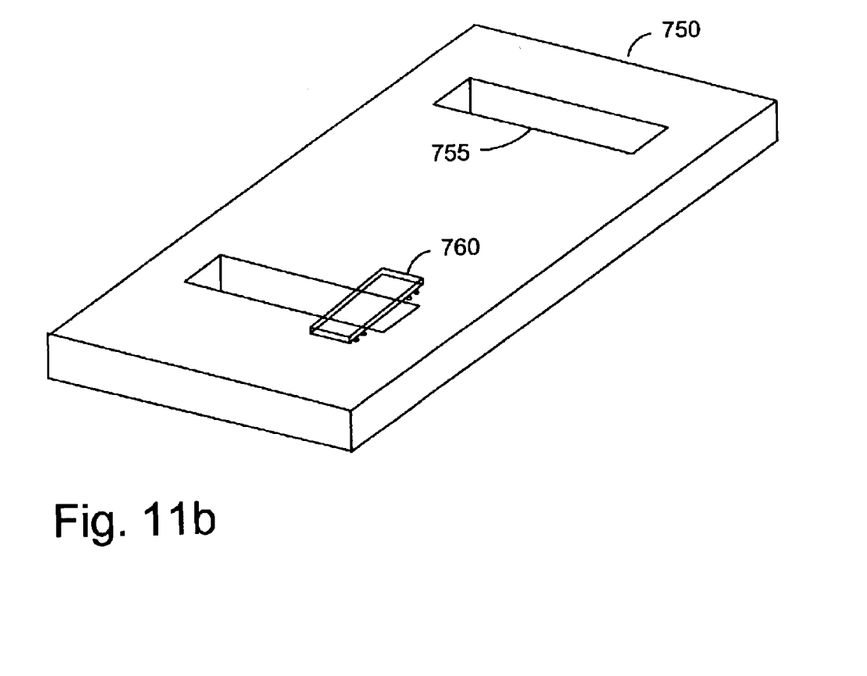

FIG. 11b shows an embodiment of a substrate or board that can accommodate an optical assembly array, such as that of FIG. 11a. The entire optical assembly array may be inserted into one or more large through-holes 755 of the board/substrate 750 to couple multiple optical signals from a first array of optical or optoelectronic components to a second array of optical or optoelectronic components. The optical spacers may comprise materials of different refractive indices so that there is a high degree of total internal reflection, and low coupling losses or cross-talk to adjacent optical pathways. An example optical or optoelectronic component 760 is coupled to the board/substrate 750, to provide good passive alignment with one of the waveguides of the optical assembly 700.

Figure 12:
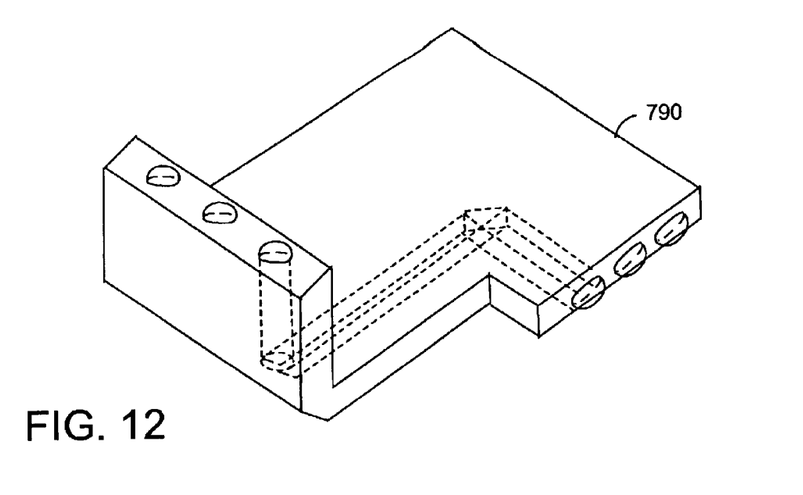
FIG. 12 shows an embodiment of an optical assembly that redirects light into a different plane than the one from which it originated.

FIG. 12 shows an embodiment of an optical assembly 790 that redirects light into a different plane than the one from which it originated. This configuration may be useful, for example, in a system that employs a backplane. For example, a motherboard may be inserted into the system in one plane, other circuit boards may be inserted perpendicular to the motherboard, and the optical assembly may optically couple components on the motherboard with components on the circuit boards. The optical assembly 790 may be fabricated to adjust to various configurations of circuit boards/substrates. The optical assembly could additionally be used to add mechanical stability to the system by maintaining proper spacing between two or more circuit boards. Another embodiment to achieve the same purpose would be to replace the coupler internal to the assembly with a bent or curved portion of the waveguide to achieve the same 90 degree change in direction. The minimum radius of curvature of such a bend would depend on the refractive indices of the materials used to form the waveguide.

Figure 13:
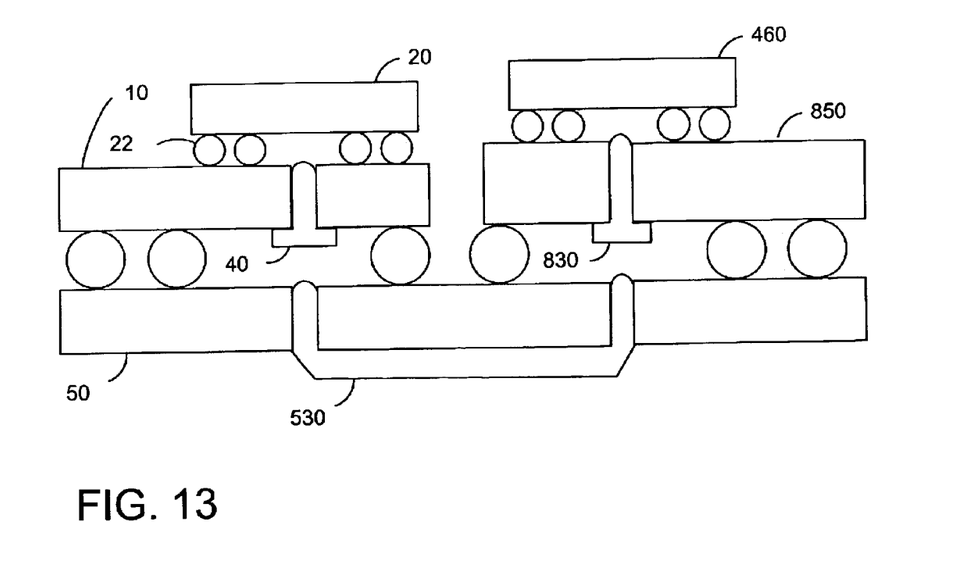
FIG. 13 shows an embodiment that combines the optical thumbtack of FIG. 2 and the optical assembly of FIG. 9.

FIG. 13 shows an embodiment that combines the optical thumbtack of FIG. 2 and the optical assembly of FIG. 9. In this embodiment, the optical thumbtack 40 conditions (for example, collimates) light from the optical or optoelectronic component 20 and sends the light into the optical assembly 530, which redirects the light at optical thumbtack 830. Optical thumbtack 830 conditions (for example, focuses) light received from optical assembly 530 and sends the light to optical or optoelectronic component 460.

In one embodiment, optical or optoelectronic component 460 may be mounted to a different substrate than that of optical or optoelectronic component 20. Substrate 850 may have a different height offset from substrate/board 50 than that of substrate 10. Furthermore, by employing the optical assembly of FIG. 12 with the optical thumbtacks, one could readily provide a system in which optical or optoelectronic component 460 is in a plane different than, for example, perpendicular to, that of optical or optoelectronic component 20.

Figure 14:
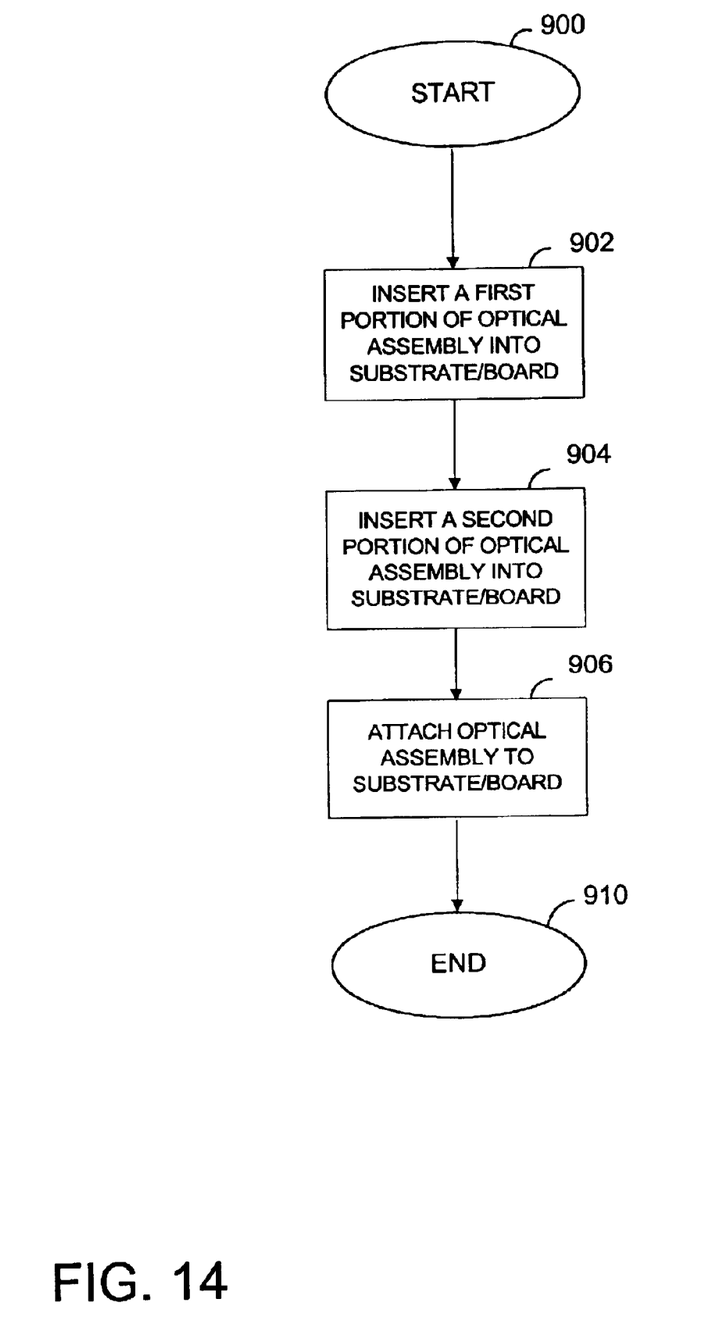
FIG. 14 is a flowchart showing a method of coupling a first optical or optoelectronic component to a second optical or optoelectronic component.

FIG. 14 is a flowchart showing a method of coupling a first optical or optoelectronic component to a second optical or optoelectronic component. The flowchart starts at block 900 and continues at block 902, at which a first portion of an optical assembly is inserted into a substrate or board. In this case, the optical assembly is inserted into a precision-defined area of the substrate/board (as may be produced by, for example, lithographic definition). This may be a through-hole, or may simply be a precision-defined notch in the substrate/board, which accurately holds the optical assembly in place, and automatically provides good passive optical alignment with the first optical or optoelectronic component. The flowchart continues at block 904, at which a second portion of the optical assembly is inserted into a substrate/board. It may be inserted into the same substrate/board as that of the first portion of the optical assembly, or it may be inserted into a different substrate/board. Similarly, the second portion of the optical assembly is held in place and good passive optical alignment is automatically provided with the second optical or optoelectronic component At block 906, the optical assembly may be attached to the one or more substrates/boards via an adhesive or an epoxy. The flowchart ends at block 910.

Thus, a method and apparatus for optically transmitting light is disclosed. However, the specific embodiments and methods described herein are merely illustrative. For example, although some of the detailed description refers solely to a substrate, a circuit board may be similarly employed. Numerous modifications in form and detail may be made without departing from the scope of the invention as claimed below. The invention is limited only by the scope of the appended claims.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

What is claimed is:

1. An apparatus comprising:
a substrate having a through-hole;
an optical or optoelectronic device positioned in at least partial optical alignment with the through-hole; and
an optical thumbtack inserted into the through-hole, wherein the optical thumbtack comprises a lens portion, a spacer portion, and a foot portion.

2. The apparatus of claim 1, wherein the foot portion of the optical thumbtack rests on a surface of the substrate.

3. The apparatus of claim 2, wherein a base of the foot portion is angled in a plane that is not perpendicular to an axis of the optical thumbtack.

4. The apparatus of claim 1, wherein the foot portion abuts against a bottom surface of the substrate and the lens portion is located at least partially within the through-hole.

5. The apparatus of claim 1, wherein the foot portion comprises a second lens portion.

6. The apparatus of claim 1, wherein the foot portion abuts against a top surface of the substrate and the lens portion is located between the substrate and the optical or optoelectronic device.

7. The apparatus of claim 6, wherein the optical thumbtack further comprises a second lens portion, the second lens portion located at least partially within the through-hole.

8. The apparatus of claim 1, further comprising a waveguide, the waveguide positioned in optical alignment with the optical thumbtack.

9. The apparatus of claim 8, wherein an air gap separates the waveguide from the optical thumbtack.

10. The apparatus of claim 1, wherein the optical thumbtack comprises a polymer.

11. The apparatus of claim 10, wherein the optical thumbtack comprises polycarbonate, polyimide, polycyanurates or benzocyclobutene (BCB).

12. The apparatus of claim 1 further comprising:
at least one anti-reflective coating on the optical thumbtack.

13. The apparatus of claim 1, wherein the optical or optoelectronic device comprises a photodetector.

14. The apparatus of claim 1, wherein the optical or optoelectronic device comprises a laser.

15. The apparatus of claim 1, wherein the optical or optoelectronic device comprises a vertical-cavity surface-emitting laser (VCSEL).

16. A method of conditioning light on its path to or from an optical or optoelectronic device mounted to a substrate, the method comprising:
inserting an optical thumbtack into a through-hole of the substrate, the optical thumbtack comprising a lens portion, a spacer portion, and a foot portion; and
pushing the optical thumbtack into the through-hole until the foot portion stops the optical thumbtack from being inserted further.

17. The method of claim 16, further comprising securing the optical thumbtack including attaching the optical thumbtack to the substrate with an adhesive or epoxy.

18. The method of claim 16, wherein the optical thumbtack is one of an array of optical thumbtacks joined by their respective foot portions, and the array of optical thumbtacks is aligned to respective optical or optoelectronic devices.

19. The method of claim 18 further comprising:
securing the array of optical thumbtacks to the substrate.

20. A method of conditioning light comprising:
inserting an optical thumbtack into a through-hole of a substrate, the optical thumbtack comprising a lens portion, a spacer portion, and a foot portion; and
pushing the optical thumbtack into the through-hole until the foot portion stops the optical thumbtack from being inserted further; and
providing light into the optical thumbtack.

21. The method of claim 20, further comprising:
bonding the optical thumbtack to the substrate.

22. The method of claim 20, further comprising:
applying at least one anti-reflective coating to the optical thumbtack.

23. A method of conditioning light comprising:
inserting an array of optical thumbtacks into one or more through-holes of a substrate, the array of optical thumbtacks comprising lens portions, spacer portions or a common spacer portion, and a common foot portion; and
pushing the array of optical thumbtacks into the through-holes until the foot portion stops the array of optical thumbtacks from being inserted further; and
optically coupling the array of optical thumbtacks to one or more optical or optoelectronic devices.

24. The method of claim 23, further comprising:

bonding the array of optical thumbtacks to the substrate.

25. The method of claim 23, further comprising:

applying at least one anti-reflective coating to the array of optical thumbtacks.

26. A method of coupling an optical or optoelectronic device in a system comprising:

attaching a first optical or optoelectronic device to a first surface;

attaching a second optical or optoelectronic device to a second surface;

inserting one or more optical thumbtacks into one or more through-holes aligned to the first and/or second optical or optoelectronic device; and optically coupling the one or more optical thumbtacks together via at least one waveguide or waveguide array.

27. The method of claim 26, further comprising:

providing light from the first optical or optoelectronic device, and receiving the light by the second optical or optoelectronic device.

28. A system comprising:

a substrate;

an optical thumbtack inserted into the substrate, the optical thumbtack having a lens portion, a spacer portion, and a foot portion;

an optical or optoelectronic component coupled to provide a light beam to the optical thumbtack causing the optical thumbtack to provide a conditioned beam;

a waveguide for optically coupling the conditioned beam to a receiving optical or optoelectronic component.

29. The system of claim 28, further comprising:

a second optical thumbtack to condition the beam from the wave guide and send the beam to the receiving optical or optoelectronic component.

30. The system of claim 29, wherein the second optical thumbtack has an anti-reflective coating.

31. The system of claim 28, wherein the optical thumbtack has an anti-reflective coating.

* * * * *

UNITED STATES PATENT AND TRADEMARK OFFICE
CERTIFICATE OF CORRECTION

PATENT NO. : 6,792,179 B2 Page 1 of 1
DATED : September 14, 2004
INVENTOR(S) : Lu et al.

It is certified that error appears in the above-identified patent and that said Letters Patent is hereby corrected as shown below:

<u>Column 4,</u>
Line 28, delete "arrays.of" and insert -- arrays of --.

Signed and Sealed this

Seventeenth Day of May, 2005

JON W. DUDAS
*Director of the United States Patent and Trademark Office*